US007635864B2

(12) United States Patent
Jeong

(10) Patent No.: US 7,635,864 B2
(45) Date of Patent: Dec. 22, 2009

(54) ORGANIC LIGHT EMITTING DEVICE

(75) Inventor: Yunsik Jeong, Seoul (KR)

(73) Assignee: LG Electronics Inc., Seoul (KR)

( * ) Notice: Subject to any disclaimer, the term of this patent is extended or adjusted under 35 U.S.C. 154(b) by 20 days.

(21) Appl. No.: 11/987,750

(22) Filed: Dec. 4, 2007

(65) Prior Publication Data

US 2009/0134392 A1 May 28, 2009

(30) Foreign Application Priority Data

Nov. 27, 2007 (KR) .................. 10-2007-0121542
Nov. 27, 2007 (KR) .................. 10-2007-0121546

(51) Int. Cl.
*H01L 29/04* (2006.01)
*H01L 29/22* (2006.01)

(52) U.S. Cl. ............... 257/59; 257/72; 257/88; 257/91; 257/E25.008; 257/E27.111; 257/E27.116; 257/E39.007; 438/82; 438/99

(58) Field of Classification Search ............ 257/59, 257/72, 88, 91
See application file for complete search history.

(56) References Cited

U.S. PATENT DOCUMENTS 5,668,379 A  9/1997  Ono et al. ................ 257/59
6,297,161 B1  10/2001  Sah
2001/0020994 A1  9/2001  Kaneko et al. ............ 349/147
2005/0045887 A1*  3/2005  Kang et al. ............... 257/66
2005/0116630 A1*  6/2005  Kim et al. ................ 313/506
2005/0250273 A1*  11/2005  Harano et al. ............ 438/197
2007/0063645 A1*  3/2007  Yokoyama ............... 313/506

FOREIGN PATENT DOCUMENTS

KR  10-2003-0074246  9/2003
KR  10-2005-0111693  11/2005
KR  10-2006-0094934  8/2006

* cited by examiner

*Primary Examiner*—Dao H Nguyen
(74) *Attorney, Agent, or Firm*—KED & Associates LLP

(57) ABSTRACT

An organic light emitting device includes a transistor having gate, source, and drain electrodes, and first electrode connected to one of the source or drain electrodes. The device also includes an emitting layer positioned on the first electrode and a second electrode positioned on the emitting layer. Each of the source and drain electrodes includes first, second, and third layers having different tapered angles. The first electrode may include a metallic layer and a conductive layer, with a tapered angle of the metallic layer being different from a tapered angle of the conductive layer.

2 Claims, 9 Drawing Sheets

ORGANIC LIGHT EMITTING DEVICE

This application claims the benefit of Korean Patent Application No. 10-2007-0121546 and 10-2007-0121542 both filed Nov. 27, 2007, the subject matters of which are incorporated herein by reference.

BACKGROUND

1. Field

One or more embodiments described herein relate to a display device.

2. Background

The importance of flat panel displays has recently increased with consumer demand for multimedia products and services. An organic light emitting device (OLED) is desirable because it has a rapid response time, low power consumption, self-emission structure, and wide viewing angle. In spite of their many advantages, OLEDs tend to have non-uniform luminance characteristics which degrade reliability.

DETAILED DESCRIPTION

An organic light emitting diode incorporated within an organic light emitting device is a self-emission device in which a light emission layer is formed between two electrodes positioned on a substrate. Generally, there are several types of OLEDs: a top-emission type, a bottom-emission type, and a dual-emission type. These devices may differ, for example, based on the direction in which light is emitted. OLEDs may also be classified as passive matrix or active matrix devices.

In operation, scan, data, and power signals supplied to a sub-pixels disposed in matrix form generate light which form an image. In one type of OLED, a thin film is formed on a substrate and patterned to form wirings and electrodes. Because the wirings or electrodes are formed as single layers, step coverage may be degraded. In addition, when a signal or power is applied, wire resistance tends to be high, thereby degrading display quality and reliability.

Figure 1:
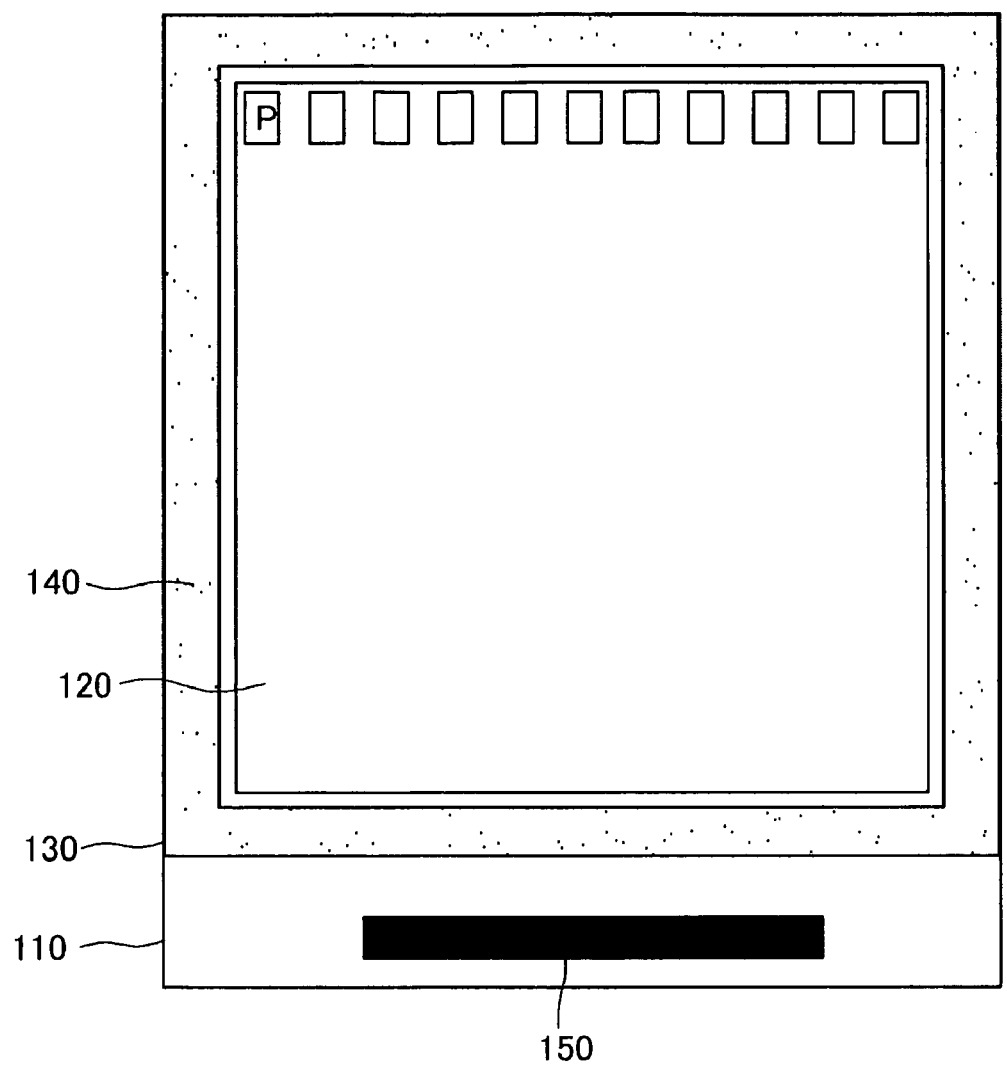
FIG. 1 is a view of one embodiment of an organic light emitting device.

FIG. 1 shows one embodiment of an organic light emitting device. This device includes a display part 120 with a plurality of sub-pixels (P) positioned thereon on a substrate 110.

The sub-pixels positioned on the substrate are susceptible to moisture or oxygen. Thus, a sealing substrate 130 is provided and an adhesive member 140 is formed at outer edge portions of the substrate of the display part 120 to seal the substrate and sealing substrate. Meanwhile, the sub-pixels may be driven by a driver 150 positioned on the substrate. The driver generates signals to cause an image to be displayed.

The sub-pixels (P) may emit red, green, or blue. Preferably, sub-pixels emitting all three colors are grouped to define a single unit pixel within the device. Alternatively, or additionally, each unit pixel may be formed from one or more sub-pixels that emit white light, white light in combination with sub-pixels that emit red, green, and blue light, and/or the one or more of the aforementioned combinations of sub-pixels taken with sub-pixels that emit other colors, e.g., orange, yellow, etc. According to one embodiment, a unit pixel may therefore be formed from four sub-pixels that emit light of different colors, e.g., white, red, green, and blue. In still another embodiment, white pixels may be used with one or more color filters to generate light of various combinations of colors. In this latter embodiment, light from the white sub-pixels may also be allowed to pass unfiltered.

In terms of structure, all or a portion of the sub-pixels forming each unit pixel may comprise an emitting layer. The emitting layer may be formed from or coupled with a hole injection layer, hole transport layer, electron transport layer, electron transport layer, or various combinations thereof. The sub-pixels may also include a buffer layer and/or a blocking layer that controls the flow of holes or electrodes between anode and cathode electrodes.

The sub-pixels may further include an organic light emitting diode (OLED) connected with a source or drain electrode of a driving transistor included in a transistor array positioned on substrate 110. The transistor array may comprise one or more transistors and capacitors, and each of the transistors in the array may include a switching transistor that switches a scan signal and the driving transistor that drives a data signal.

Figure 2A:
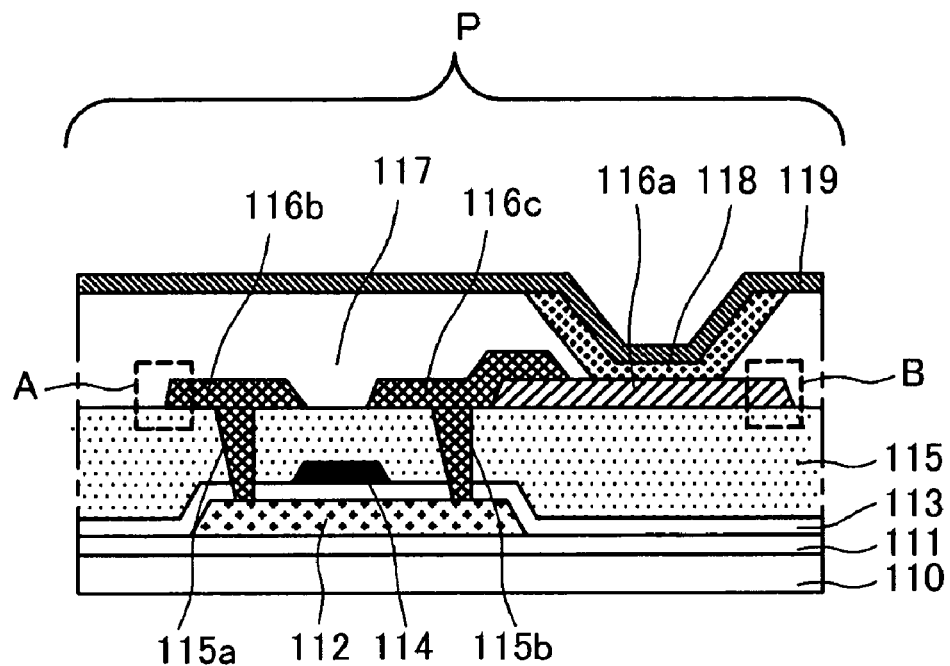
FIG. 2 is a sectional view of a sub-pixel that may be included in the organic light emitting device of FIG. 1.

FIG. 2A shows a sectional view of one embodiment of a sub-pixel of the organic light emitting device in FIG. 1. In forming the sub-pixel/device, substrate 110 may be made of a material having good mechanical strength and size stability. For example, the substrate may be made from a glass plate, a metal plate, a ceramic plate, a plastic plate (e.g., a polycarbonate resin, acryl resin, vinyl chloride resin, polyethylene terephthalate resin, polyimide resin, polyester resin, epoxy resin, silicon resin, fluorine resin, etc.), or the like.

A buffer layer 111 may be positioned on the substrate. This layer may be formed to protect a TFT to be formed in a follow-up process against impurities such as alkali ions generated from the substrate. The buffer layer may be made, for example, of silicon oxide ($SiO_2$) or silicon nitride (SiNx).

A semiconductor layer 112 may be positioned on the buffer layer and may be made of amorphous silicon or polycrystalline silicon obtained by crystallizing amorphous silicon. Although not shown, the semiconductor layer may include a channel region, source region, and drain region. P-type or N-type impurities may be doped into the source or drain regions.

A gate insulating layer 113 may be positioned on the substrate with semiconductor layer 112 formed thereon. The gate insulating layer may be formed by selectively using silicon oxide ($SiO_2$) or silicon nitride (SiNx).

A gate electrode 114 may be positioned on the gate insulating layer 113 at a location that corresponds, for example, to the channel region or another region of semiconductor layer 112. The gate electrode may be made of aluminum (Al), an aluminum (Al) alloy, titanium (Ti), silver (Ag), molybdenum (No), a molybdenum (Mo) alloy, tungsten (W), or tungsten silicide ($WSi_2$) or a combination thereof.

An interlayer insulating layer 115 may be positioned over the substrate including gate electrode 114 formed thereon. The interlayer insulating layer may be or include an organic layer or an inorganic layer, or a composite layer comprising an organic layer and an inorganic layer.

When the interlayer insulating layer is or includes an inorganic layer, it may be made of silicon oxide ($SiO_2$), silicon nitride (SiNx), or SOG (Silicate On Glass). When the interlayer insulating layer is or includes an organic layer, it may comprise an acrylic resin, a polyimide resin, or a benzocyclobutene (BCB) resin. First and second contact holes 115a and 115b that expose portions of semiconductor layer 112 may be positioned within interlayer insulation layer 115 and gate insulating layer 113.

A first electrode 116a may be positioned on the interlayer insulating layer. The first electrode may be an anode and formed to have a single-layer structure comprising a conductive layer made of such as ITO (Indium Tin Oxide) or IZO (Indium Zinc Oxide). Alternatively, the first electrode may be formed to have a multi-layer structure comprising a conductive layer made of such as ITO or IZO.

A source electrode 116b and drain electrode 116c may be positioned on the interlayer insulating layer. The source and drain electrodes 116b and 116c may be electrically connected via first and second contact holes 115a and 115b. A portion of the drain electrode 116c is positioned on the first electrode 116a and electrically connected with the first electrode 116a.

The source and drain electrodes 116b and 116c may contain a low resistance material. Also, the source and drain electrodes may be formed to have a multi-layer structure that includes a metallic layer made, for example, of aluminum (Al), Alnd, molybdenum (Mo), chromium (Cr), TiN, MoN, or CrN.

The transistor on substrate 110 may include gate electrode 114 and source and drain electrodes 116b and 116c, and the transistor array may include the plurality of transistors and capacitors which are electrically connected with the organic light emitting diode (OLED).

An insulating layer 117 exposing a portion of first electrode 116a may be positioned on the first electrode, which, for example, may be an anode. The insulating layer may be made of an organic material such as benzocyclobutene (BCB) resin, acrylic resin, or polyimide resin.

An emitting layer 118 may be positioned on the exposed first electrode 116a, and a second electrode 119 (e.g., a cathode) may be positioned on the emitting layer. The second electrode may be a cathode that supplies electrodes to the emitting layer and may be made of magnesium (Mg), silver (Ag), calcium (Ca), aluminum (Al), or their alloys.

In accordance with one embodiment, the organic light emitting diode (connected with source electrode 116b or drain electrode 116c) may comprise the first electrode 116a, the emitting layer 118 and the second electrode 119.

Figure 2B:
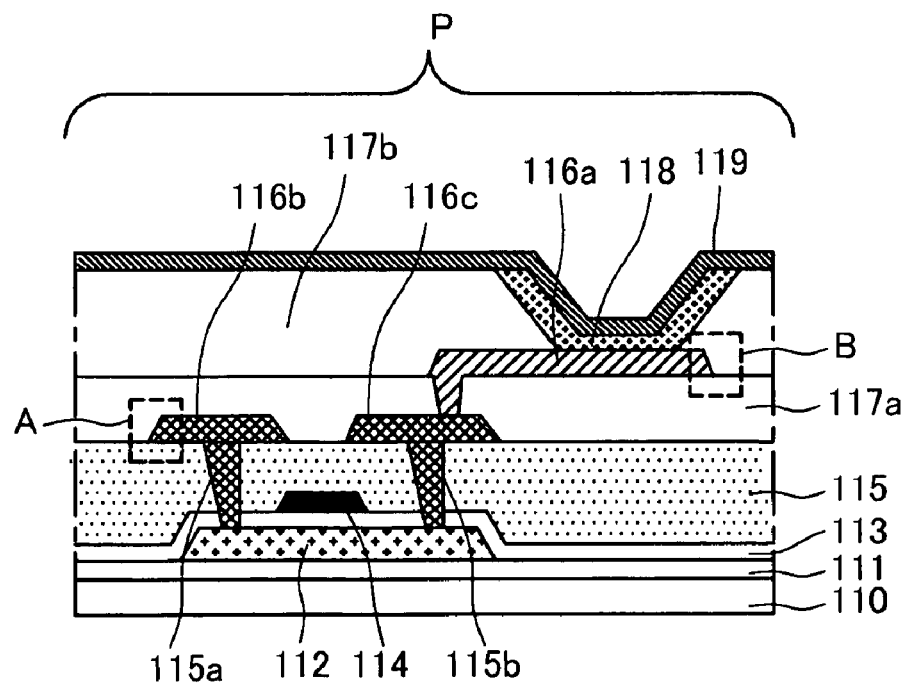

With reference to FIG. 2B, unlike the case as shown in FIG. 2A, the first electrode 116a positioned on the source or drain electrode 116b or 116c may be positioned on a planarization film 117a that planarizes the surface of the transistor array.

In this case, an insulating layer 117b may be positioned to expose a portion of the first electrode 116a (e.g., an anode) on the planarization film 117a.

The first electrode 116a positioned on the source electrode 116b or drain electrode 116c may be positioned on a planarization film that planarizes the surface of the transistor array. The structure of the transistors of the transistor array may vary based on whether a gate structure is a top gate or a bottom gate. In addition, the structure of the transistors may vary depending on number of masks used for forming the transistor array and the material of the semiconductor layer. In other embodiments, the sub-pixels may have a different structure.

Figure 3:
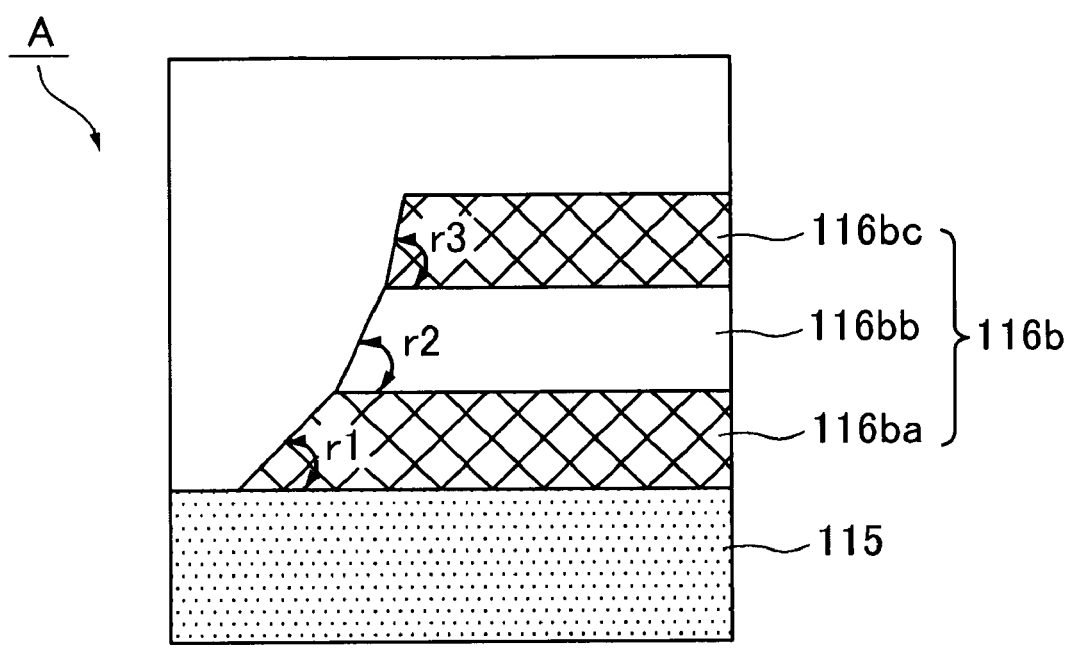
FIG. 3 is an enlarged view showing one example of a source or drain electrode that may be included in region 'A' in FIG. 2.

FIG. 3 shows one example of a source or drain electrode in a region 'A' of FIG. 2. For the sake of explanation, the description will be focused on the source electrode 116b as shown in the region 'A'. However, the structure as shown in the region 'A' can be also applied to drain electrode 116c as well as to source electrode 116b. In this respect, the positions of the source and drain electrodes 116b and 116c may differ according to the structure of the sub-pixels.

The source electrode 116b (including the drain electrode) as shown in the region 'A' in FIG. 3 may be positioned on interlayer insulating layer 115, which is positioned on substrate 110. In addition, the source electrode 116b (including the drain electrode) may be positioned on a different insulating material such as the planarization film, not the interlayer insulating layer 115.

The source electrode 116b may be formed to have a three-layer structure by stacking one or more different materials. That is, the source electrode may include first to third layers 116ba, 116bb, and 116bc, each of which have sloped edge portions. In accordance with one embodiment, at least two of these layers have different tapered angles. In accordance with another embodiment, all three layers have different tapered angles relative to one another. The tapered angles may be defined, for example, by the slope of the edge portion of the electrode, e.g., the angle between a lower surface of each layer and the sloped edge of that layer.

The first and third layers 116ba and 116bc may be made of the same material, and the first and second layers 116ba and 116bb may be made of different materials. For example, the stacked structure of the first to third layers 116ba, 116bb, and 116bc may be made, for example, of molybdenum/aluminum/molybdenum (Mo/Al/Mo) or molybdenum/Alnd/molybdenum Mo/Alnd/Mo).

Also, the first layer 116ba may be selectively made of metal that can improve ohmic contact characteristics. The second layer 116bb may be selectively made of metal that can lower specific resistance. And, the third layer 116bc may be selectively made of metal that may not be easily etched in the process of a different metallic layer.

In accordance with one embodiment, the tapered angle r1 of the first layer 116ba serving as a base may lie within a range of about 30° to 50°. When the tapered angle r1 of the first layer 116ba is 30° or greater, a step coverage of the first layer can be improved. In addition, the formation of the second and third layers 116bb and 116bc can be facilitated, as well as the first layer 116ba at the corresponding portion defined on the substrate.

If the tapered angle r1 of the first layer 116ba is 50° or smaller, the first layer 116ba may be formed so as to maintain step coverage of the first layer 116ba. In addition, a contact area with the second layer 116bb formed on the first layer 116ba may be secured.

A tapered angle r2 of the second layer 116bb positioned on the first layer 116ba may lie within the range of about 50° to 70°. If the tapered angle r2 of the second layer 116bb is 50° or greater, the step coverage of the second layer 116bb can be improved. In addition, it can facilitate the formation of the second layer 116bb on the corresponding limited portion of the first layer 116ba.

If the tapered angle r2 of the second layer 116bb is 70° or smaller, the second layer 116bb may be formed on the first layer 116ba so as to maintain step coverage of the second layer 116*bb*. In addition, a contact area with the third layer 116*bc* formed on the second layer 116*bb* can be obtained.

A tapered angle r3 of the third layer 116*bc* positioned on the second layer 116*bb* may lie within the range of about 70° to 90°. If the tapered angle r3 of the third layer 116*bc* is 70° or greater, the step coverage of the third layer 116*bc* can be improved. In addition, the third layer 116*bc* may be easily formed on the corresponding limited portion of the second layer 116*bb*.

If the tapered angle r3 is 90° or smaller, the third layer 116*bc* can contact with the first electrode 116*a*, a pixel electrode, so as to maintain step coverage. In this case, the third layer 116*bc* may be electrically connected with a portion of the first electrode 116*a*, the pixel electrode, as shown in FIG. 2, and this may differ according to how the thin films are formed. That is, one or more of the first and second layers 116*ba* and 116*bb*, but not the third layer 116*bc*, may be electrically connected with the first electrode 116*a*, the pixel electrode.

When the source and drain electrodes are formed to have such a structure including the first to third layers 116*ba*, 116*bb* and 116*bc*, the thickness of each layer may be set based on the second layer 116*bb*.

This is because the second layer 116*bb*, namely, the intermediate layer, determines attachment (bonding) or contact area and serves to reduce wiring resistance between the lower and upper layers, so it is advantageous to set the thickness of each layer based on the second layer 116*bb*.

Namely, because the source and drain electrodes are to have a low resistance to transfer power, it is more advantageous to use the second layer positioned between the first and third layers 116*ba* and 116*bc* by forming it to be thicker, than using the first or third layer 116*ba* or 116*bc*.

Here, the thickness ratio of the first and second layers may be 1:2.25~22.5. And the thickness ratio of the third and second layers may be 1:1.2~9.

The thickness of the second layer 116*bb*, the intermediate layer, may be 450 Å to 4,500 Å, that of the first layer 116*ba* may be 20 Å to 200 Å, and that of the third layer may be 50 Å to 500 Å.

The reason why the thickness ratio of the first and second layers is 1:2.25~22.5 is because, with such a thickness ratio, the first layer 116*ba* may be formed within a range that there is no resistance difference between the second and first layers 116*bb* and 116*ba* and the first layer 116*ba* may not only serve as an ohmic-contact layer of the source and drain electrodes but also serve to improve adhesive strength with the lower interlayer insulating layer 115. Thus, the first layer 116*ba* can be formed to be so thin, compared with the second layer 116*bb*, as to sufficiently perform such functions.

The reason why the thickness ratio of the third and second layers is 1:1.2~9 is because, with such a thickness ratio, the third layer 116*bc* may be formed within an range that there is no resistance difference between the second and third layers 116*bb* and 116*bc*, and can be formed to protect the lower second layer 116*bb* (e.g., it prevents the second layer 116*bb* from being etched during an etching process in forming the first electrodes of the organic light emitting diode), rather than the aspect of resistance.

Accordingly, the third layer 116*bc* may be formed to be so thin, compared with the second layer 116*bb*, as to perform such function, but may be formed to be thicker than the first layer 116*ba*.

Figure 4:
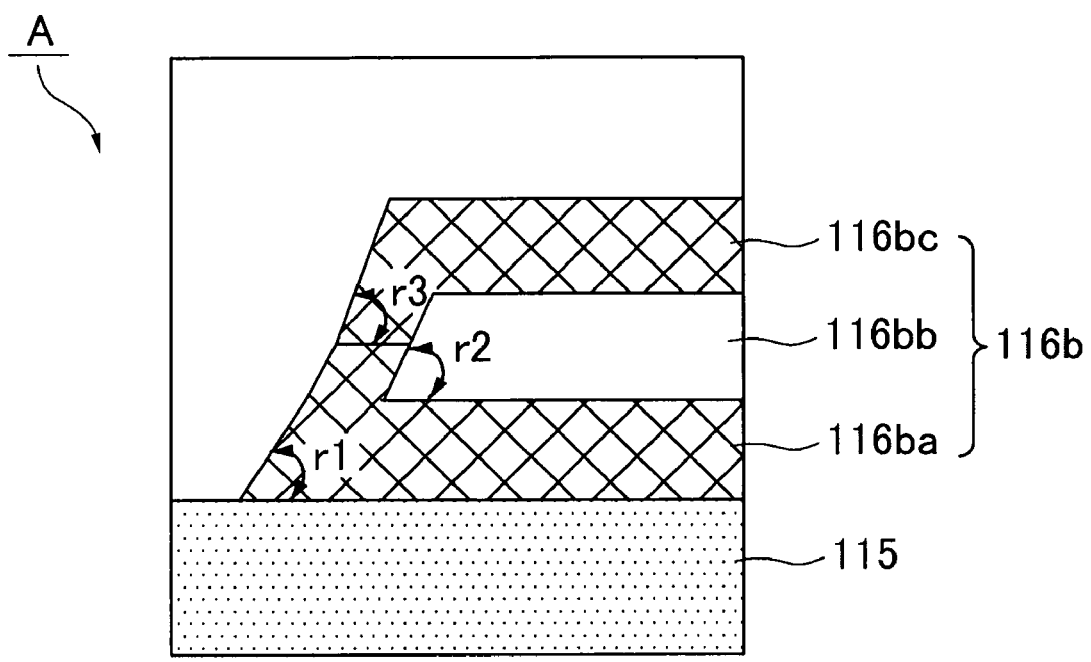
FIG. 4 is a view showing another example of a source or drain electrode that may be included in region 'A' in FIG. 2.

FIG. 4 shows another embodiment of the source or drain electrode in the region 'A' in FIG. 2. Unlike the source electrode as shown in FIG. 3, the source electrode 116*b* shown in FIG. 4 may have such a structure that the first and third layers 116*ba* and 116*bc* hermetically seal the second layer 116*bb*. In this case, the first and third layers 116*ba* and 116*bc* contact directly.

Accordingly, when the first and third layers 116*ba* and 116*bc* are made of the same material, their electrical characteristics may be improved. If the first and third layers 116*ba* and 116*bc* are made of different materials, because they contact directly, a problem of electrical characteristics caused by the different materials can be avoided.

Figure 5:
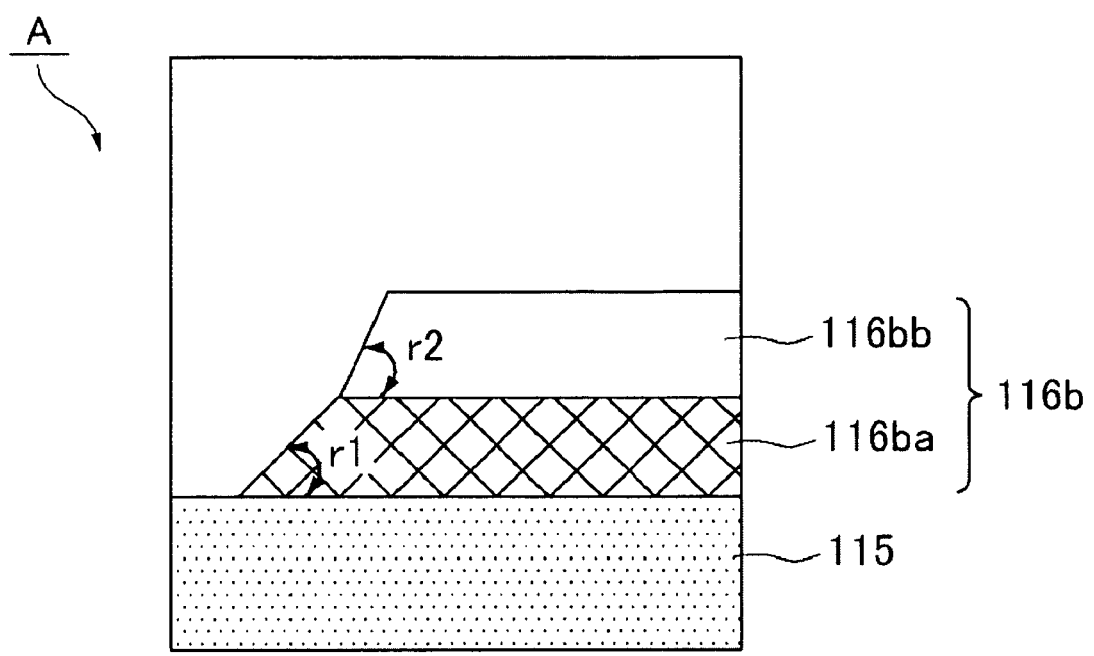
FIG. 5 is a view showing another example of a source or drain electrode that may be included in region 'A' in FIG. 2.

FIG. 5 shows another embodiment of the source or drain electrode in region 'A' in FIG. 2. As shown, the source or drain electrode has a dual-layer structure. That is, for example, source electrode 116*b* may have a dual-layer structure as shown in region 'A' and may be positioned on interlayer insulating layer 115 on the substrate. The source electrode 116*b* may be positioned on a different insulating material such as the planarization film, but not the interlayer insulating layer 115.

The source electrode 116*b* may be formed such that two layers can be stacked and made of one or more different materials. That is, the source electrode 116*b* may comprise first and second layers 116*ba* and 116*bb*. The first and second layers 116*ba* and 116*bb* may have different tapered angles. (The tapered angle may be defined by the slope of an edge of the layer relative to a lower surface of the layer).

The first and second layers 116*ba* and 116*bb* may be different metallic layers. For example, the first and second layers 116*ba* and 116*bb* may be selected from the group including molybdenum (Mo), aluminum (Al), Alnd, chromium (Cr), TiN, MoN, or CrN. Moreover, the first layer 116*ba* may be selectively made of a metal that can improve ohmic contact characteristics, and the second layer 116*bb* may be selectively made of metal that can lower specific resistance.

The tapered angle r1 of the first layer 116*ba* may lie within the range of about 70° to 90°. When the tapered angle r1 of the first layer 116*ba* is 70° or greater, critical dimension (CD) bias can be reduced to thereby reduce loss caused by wire resistance. In addition, formation of the second layer 116*bb* on the first layer 116*ba* can be facilitated. When the tapered angle r1 of the first layer 116*ba* is 90° or smaller, a contact area with the second layer 116*bb* can be secured in a state of reducing the loss caused by the wire resistance.

The tapered angle r2 of the second layer 116*bb* positioned on the first layer 116*ba* may lie within the range of about 40° to 50°. When the tapered angle r2 of the second layer 116*bb* is 40° or greater, the step coverage of the second layer can be improved. In addition, the second layer 116*bb* can be easily formed on the corresponding limited portion of the first layer 116*ba*.

When the tapered angle r2 of the second layer 116*bb* is 50° or smaller, the second layer 116*bb* can be formed on the first layer 116*ba* while maintaining improved step coverage of the second layer 116*bb*. In addition, while maintaining the step coverage, the second layer 116*bb* can contact with the first electrode 116*a*, the pixel electrode.

When the source and drain electrodes are formed to have such a structure including the first and second layers 116*ba* and 116*bb*, the thickness ratio of the first and second layers may be substantially 4~6.4:1.

The thickness of the first layer 116*ba* may be 400 Å~450 Å, and that of the second layer 116*bb* may be 70 Å~100 Å.

Here, because the source and drain electrodes are to have a low resistance to transfer power, it is advantageous to form the first layer 116*a* to be thicker than the second layer 116*bb*.

The reason why the thickness ratio of the first and second layers 116*ba* and 116*bb* is 4~6.4:1 is because, with such a thickness ratio, the first layer 116*ba* may be formed within a range that there is no resistance difference between the second and first layers 116bb and 116ba and the second layer 116bb may serve to protect the lower first layer 116ba (e.g., it prevents the first layer 116ba from being etched during an etching process in forming the first electrodes of the organic light emitting diode) rather than the aspect of resistance. Thus, the second layer 116bb can be formed to be so thin, compared with the first layer 116ba, as to sufficiently perform such function.

In this case, the second layer 116bb may be electrically connected with a portion of the first electrode 116a, the pixel electrode, as shown in FIG. 2, and this may differ according to how the thin films are formed. That is, the first layer 116ba, but not the second layer 116bb, may be electrically connected with the first electrode 116a, the pixel electrode.

In accordance with one embodiment, the thickness of the region making the tapered angle r2 of the second layer 116bb may be one-third or two-thirds the thickness of the source electrode 116b. Accordingly, the CD bias can be kept small and wire resistance can be reduced to thereby improve voltage-current characteristics.

Figure 6:
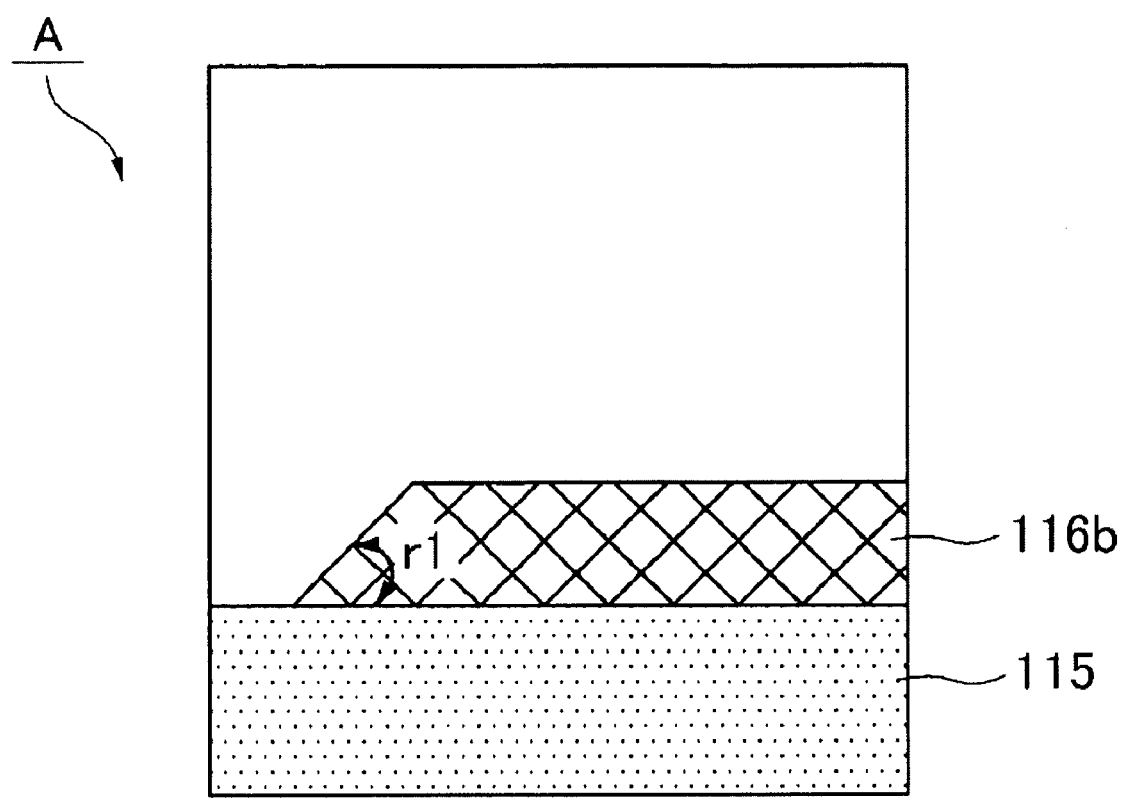
FIG. 6 is a view showing another example of a source or drain electrode that may be included in region 'A' in FIG. 2.

FIG. 6 shows another embodiment of the source or drain electrode in region 'A' in FIG. 2. In this embodiment, the source or drain electrode is formed as a single layer.

More specifically, the source electrode 116b having a single-layer structure as shown in region 'A' may be positioned on interlayer insulating layer 116 positioned on the substrate. However, the source electrode 116b (including the drain electrode) may be positioned on a different insulating material such as the planarization film, but not the interlayer insulating layer 115. In terms of materials, the source electrode may be made as a single metallic layer of, for example, molybdenum (Mo), aluminum (Al), Alnd, chromium (Cr), TiN, MoN, or CrN.

The tapered angle r1 of the source angle 116b may lie within the range of about 10° to 60°. When the tapered angle r1 of the source electrode 116b is 10° or greater, the tapered angle r1 of the source electrode 116b may be reduced while step coverage of the source electrode 116b can be improved. When the tapered angle r1 of the source electrode 116b is 60°, step coverage conditions of the source electrode 116 can be maintained while the problem of contact deficiency with the first electrode 116a, the pixel electrode, which is to contact with the source electrode 116b, can be solved.

Figure 7:
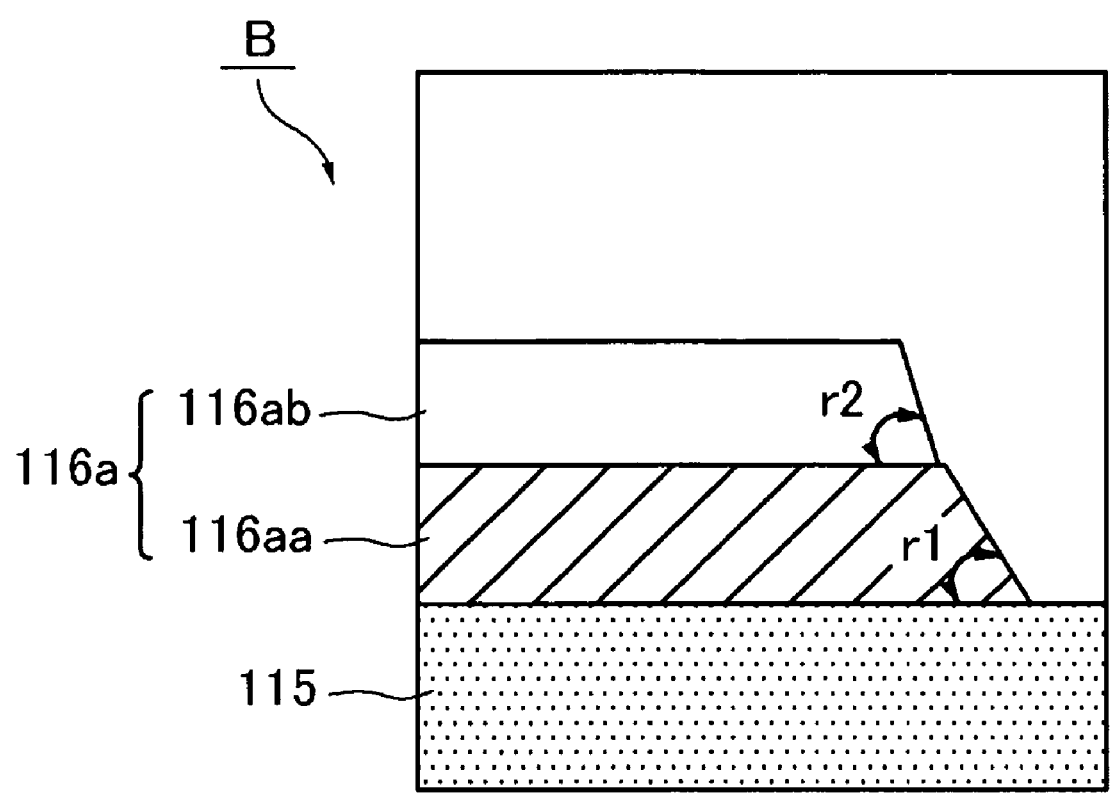
FIG. 7 is a view showing one example of a first electrode that may be included in region 'B' in FIG. 2.

FIG. 7 shows an embodiment of the first electrode in region 'B' in FIG. 2. In this embodiment, the first electrode has a dual-layer structure. Also, the structure of the first electrode 116a, the pixel electrode, may differ depending on a light emission method, e.g., top-emission type and bottom-emission type. Also, the material of the first electrode may vary according to the light emission method. The first electrode may have such an inverted structure that the electrode is turned over.

In accordance with one embodiment, the first electrode 116a in region 'B' may operate as an anode. Also, the structure in region 'B' may be applied to form a second electrode (not shown), namely a cathode, as well as for the first electrode 116a operating as an anode.

The first electrode 116a as shown in the region 'B' in FIG. 7 may be positioned on the interlayer insulating layer 115 on the substrate. Also, the first electrode 116a may be positioned on a different insulating material such as the planarization film, but not the interlayer insulating layer 115.

Structurally, the first electrode may be formed as the dual-layer by stacking one or more different materials. The dual-layer structure of the first electrode may include a metallic layer 116aa and a conductive layer 116ab on the metallic layer 116aa. The metallic layer 116aa may be made of, for example, aluminum (Al) or silver (Ag) and the conductive layer 116ab may be made of, for example, ITO or IZO.

The metallic layer 116aa may be selectively made of metal that can obtain low resistance ratio and high reflexibility of about 95% at a visible light region in case of top light emission. The conductive layer 116ab may be selectively made of a conductor that has high adhesive strength with the metallic layer 116aa serving as the basis and in consideration of electrical characteristics with the emitting layer positioned at an upper portion of the conductive layer 116ab.

The metallic layer 116aa and conductive layer 116ab may have different tapered angles. (The tapered angle of each layer may be defined by a slope of its edge relative to a lower surface of the layer.) The tapered angle r1 of metallic layer 116aa may lie within the range of about 35° to 70°. When the tapered angle r1 of metallic layer 116aa is 35° or greater, it can facilitate formation of conductive layer 116ab on metallic layer 116aa in a state of securing the upper area of the metallic layer 116aa. When the tapered angle r1 of metallic layer 116aa is 70° or smaller, the contact area with conductive layer 116ab formed on metallic layer 116aa can be obtained. In addition, the contact interface characteristics with the conductive layer 116ab can be improved.

The tapered angle r2 of the conductive layer 116ab positioned on metallic layer 116aa may lie within the range of about 70° to 90°. When the tapered angle r2 of the conductive layer 116ab is 70° or greater, it can facilitate formation of an emitting layer (not shown) on the conductive layer 116ab so as to secure an aperture area of the emitting layer (not shown) formed on the conductive layer 116ab. When the tapered angle r2 of conductive layer 116ab is 90° or smaller, it can facilitate formation of the emitting layer (not shown) on the conductive layer 116ab so as to secure the aperture area of the emitting layer (not shown) formed on the conductive layer 116ab to its maximum level.

When the first electrode 116a is formed to have such a structure including the metallic layer 116aa and the conductive layer 116ab, the thickness ratio of the two layers may be substantially 9.5~10:1.

Here, with the ratio of 9.5~10:1 of the metallic layer 116aa and the conductive layer 116ab, the metallic layer 116aa can serve as a reflection layer.

Figure 8:
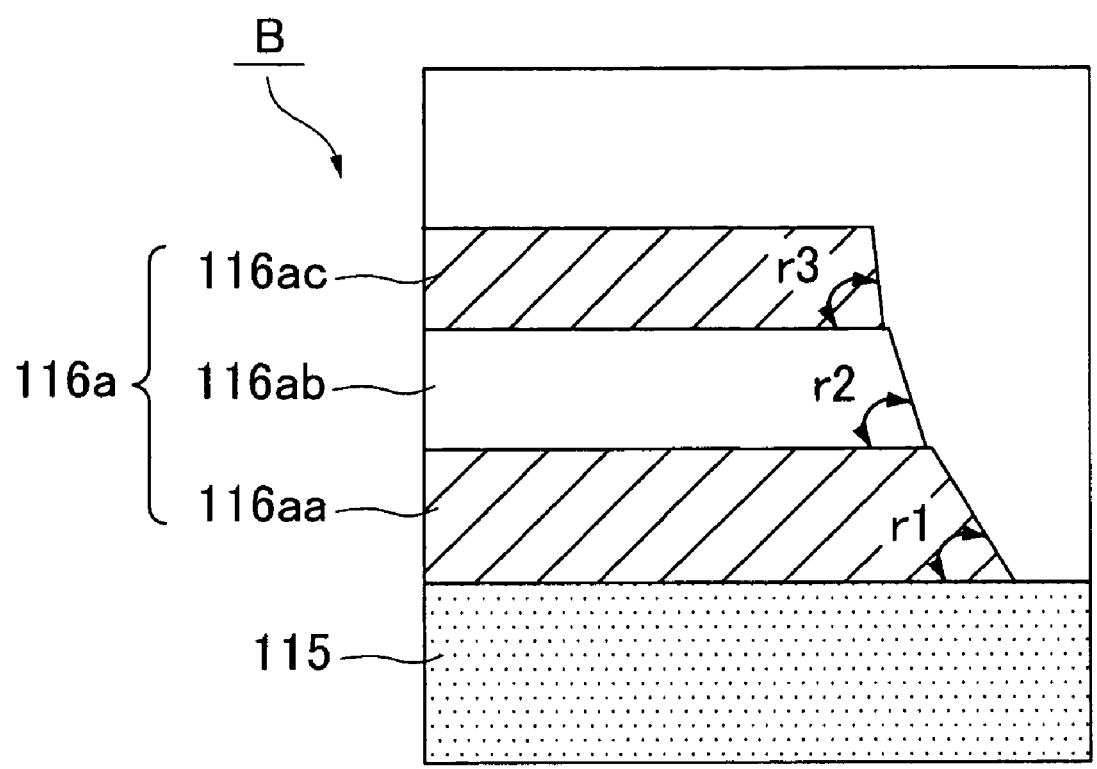
FIG. 8 is a view showing another example of a first electrode that may be included in region 'B' in FIG. 2.

FIG. 8 shows another embodiment of the first electrode in region 'B' in FIG. 2. In this embodiment, the first electrode has a triple-layer structure. Also, the first electrode 116a as shown in the region 'B; in FIG. 8 may be positioned on the interlayer insulating layer 116 on the substrate. Or, the first electrode 116a may be positioned on a different insulating material such as the planarization film, but not the interlayer insulating layer 115.

The first electrode 116a may be formed by stacking one or more different materials. For example, the first electrode 116a may comprise a first conductive layer 116aa, a metallic layer 116ab positioned on the first conductive layer, and a second conductive layer 116ac positioned on the metallic layer. The first conductive layer 116aa, metallic layer 116ab, and second conductive layer 116ac may have one or more tapered angles which are different from each other. (The tapered angles may be defined by the slope formed on the basis of the lower surface of the edge portion.)

The first and second conductive layers 116aa and 116ac may be made of, for example, ITO or IZO, and the metallic layer 116ab may be made of, for example, aluminum (Al) or silver (Ag).

The tapered angle r1 of the first conductive layer 116aa as the basis may lie within the range of about 50° to 90°. When the tapered angle r1 of the first conductive layer 116aa is 50° or greater, it can facilitate formation of the second conductive layer 116ac as well as the metallic layer 116ab on the first conductive layer 116aa in a state of securing the upper area of the first conductive layer 116aa. When the tapered angle of the first conductive layer 116aa is 90° or smaller, the contact area with the metallic layer 116ab formed on the first conductive layer 116aa can be secured. In addition, the contact interface characteristics with the metallic layer 116ab can be improved.

The tape angle r2 of the metallic layer 116ab positioned on the first conductive layer 116aa may lie within the range of about 35° to 70°. When the tapered angle r2 of the metallic layer 116ab is 35° or greater, the area of the second conductive layer 116ac to be formed on the metallic layer 116ab can be secured. When the tapered angle r2 of the metallic layer 116ab is 70° or smaller, the contact area with the second conductive layer 116ac formed on the metallic layer 116ab can be secured in the state that the upper area of the metallic layer 116ab is secured.

The tapered angle r3 of the second conductive layer 116ac positioned on the metallic layer 116ab may lie within the range of 70° to 90°. When the tapered angle r3 of the second conductive layer 116ac is 70° or greater, in a state where an aperture area of the emitting layer (not shown) formed on the second conductive layer 116ac is secured, the emitting layer (not shown) can be easily formed on the second conductive layer 116ac.

When the tapered angle r3 of the second conductive layer 116ac is 90°, in the state where the aperture area of the emitting layer (not shown) formed on the second conductive layer 116ac is secured to a maximum level, the emitting layer (not shown) can be easily formed on the second conductive layer 116ac.

When the first electrode 116a is formed to have such structure including the first conductive layer 116aa, the metallic layer 116ab, and the second conductive layer 116ac, the thickness of each layer may be set based on the metallic layer 116ab.

This is because the metallic layer 116ab, namely, the intermediate layer, serves to determine an attachment (bonding) or contact area and serves as a reflection layer between the lower and upper layers, so it is advantageous to set the thickness of each layer based on the metallic layer 116ab.

Here, in forming the first electrode 116a to have the structure including first conductive layer 116aa, the metallic layer 116ab, and the second conductive layer 116ac, the thickness ratio of respective layers may be substantially 1:9.5~10:1.

The reason is because the first conductive layer 116aa serves to improve an adhesive strength with the lower interlayer insulating layer 115, so it is formed to be thinner than the metallic layer 116ab.

Also, the second conductive layer 116ac may be formed to be thinner than the metallic layer 116ab in order to minimize a problem that chromaticity changes due to diffusion or diffraction of light reflected from the metallic layer 116ab serving as the reflection layer.

To form the tapered angle(s) of the source and drain electrodes or that of the first electrode, a photolithography process may be used in which one or more process parameters are varied. For example, the etching conditions of a photoresist pattern may be different or varied.

As described above, in accordance with one or more embodiments, one of more of the source or drain electrodes or the first electrode may be formed as a multi-layer and the tapered angles of the layers may be controlled to improve step coverage and contact interface characteristics, resulting in an improvement of display quality and the reliability of the device Additionally, the source and drain electrodes may have a triple-layer structure that includes the possibility of Ti/Al/Ti, or a double-layer structure that includes the possibility of Ti/Al.

In accordance with the embodiments described herein, the emitting layer cause light to be emitted in various colors. In a case where the emitting layer emits red light, the emitting layer may include a host material including carbazole biphenyl (CBP) or 1,3-bis(carbazol-9-yl (mCP), and may be formed of a phosphorescence material including a dopant material including PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium), or PtOEP(octaethylporphyrin platinum) or a fluorescence material including PBD:Eu(DBM)3(Phen) or Perylene.

In the case where the emitting layer emits red light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.0 to 6.0, and a lowest unoccupied molecular orbital of the dopant material may range from 2.4 to 3.5.

In the case where the emitting layer emits green light, the emitting layer includes a host material including CBP or mCP, and may be formed of a phosphorescence material including a dopant material including Ir(ppy)3(fac tris(2-phenylpyridine)iridium) or a fluorescence material including Alq3(tris(8-hydroxyquinolino)aluminum).

In the case where the emitting layer emits green light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

In the case where the emitting layer emits blue light, the emitting layer includes a host material including CBP or mCP, and may be formed of a phosphorescence material including a dopant material including (4,6-F2ppy)2Irpic or a fluorescence material including spiro-DPVBi, spiro-6P, distyryl-benzene (DSB), distyryl-arylene PSA), PFO-based polymers, PPV-based polymers, or a combination thereof.

In the case where the emitting layer emits blue light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

Various color image display methods may be implemented in an organic light emitting device such as described above. These methods will be described below with reference to FIGS. 9A to 9C.

Figure 9A:
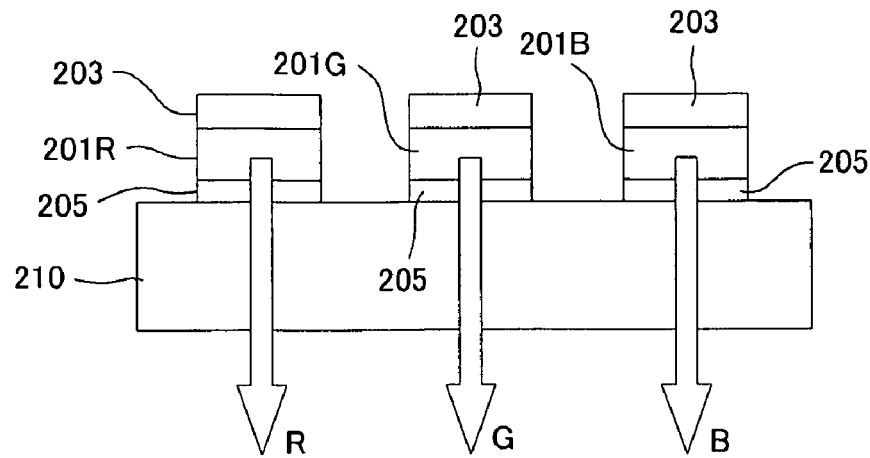
FIGS. 9A to 9C illustrate various implementations of a color image display method in an organic light emitting device according to an exemplary embodiment.
Figure 9B:
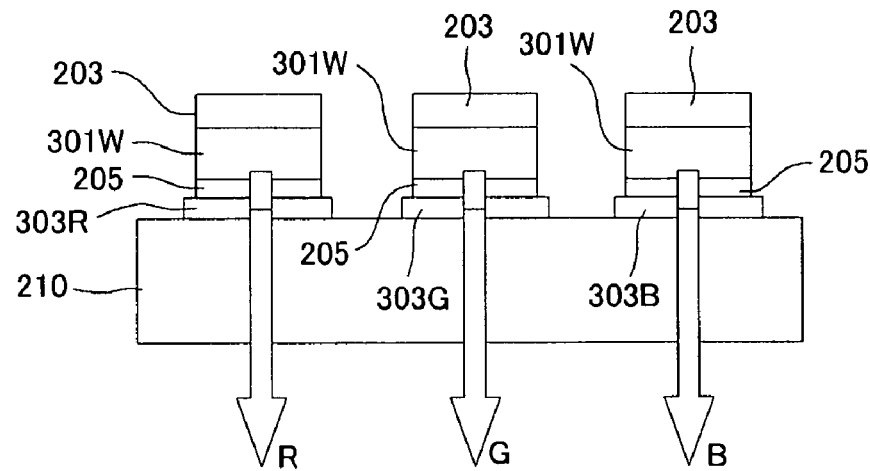
Figure 9C:
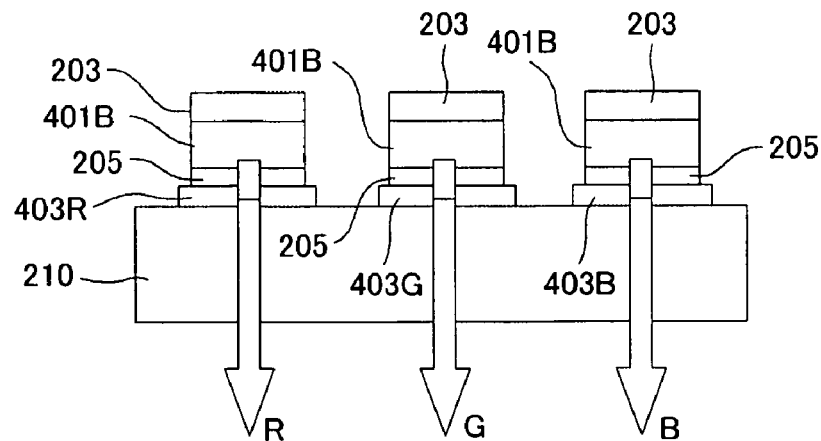

FIGS. 9A to 9C illustrate various implementations of a color image display method in an organic light emitting device according to an exemplary embodiment of the present invention.

First, FIG. 9A illustrates a color image display method in an organic light emitting device separately including a red organic emitting layer 201R, a green organic emitting layer 201G and a blue organic emitting layer 201B which emit red, green and blue light, respectively.

The red, green and blue light produced by the red, green and blue organic emitting layers 201R, 201G and 201B is mixed to display a color image.

It may be understood in FIG. 9A that the red, green and blue organic emitting layers 201R, 201G and 201B each include an electron transport layer, an emitting layer, a hole transport layer, and the like. In FIG. 9A, a reference numeral 203 indicates a cathode electrode, 205 an anode electrode, and 210 a substrate. It is possible to variously change a disposition and a configuration of the cathode electrode, the anode electrode and the substrate.

FIG. 9B illustrates a color image display method in an organic light emitting device including a white organic emitting layer 301W, a red color filter 303R, a green color filter 303G and a blue color filter 303B. And the organic light emitting device further may include a white color filter (not shown).

As illustrated in FIG. 9B, the red color filter 303R, the green color filter 303G and the blue color filter 303B each transmit white light produced by the white organic emitting layer 301W to produce red light, green light and blue light. The red, green and blue light is mixed to display a color image.

It may be understood in FIG. 9B that the white organic emitting layer 301W includes an electron transport layer, an emitting layer, a hole transport layer, and the like.

FIG. 9C illustrates a color image display method in an organic light emitting device including a blue organic emitting layer 401B, a red color change medium 403R and a green color change medium 403G.

As illustrated in FIG. 9C, the red color change medium 403R and the green color change medium 403G each transmit blue light produced by the blue organic emitting layer 401B to produce red light, green light and blue light. The red, green and blue light is mixed to display a color image.

It may be understood in FIG. 9C that the blue organic emitting layer 401B includes an electron transport layer, an emitting layer, a hole transport layer, and the like.

A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

An exemplary embodiment of the present invention provides an organic light emitting device capable of improving a step coverage of wirings or electrodes.

In an aspect, an organic light emitting device comprises a transistor positioned on a substrate and including gate, source, and drain electrodes, a first electrode connected with the source or the drain electrode; an emitting layer positioned on the first electrode; and a second electrode positioned on the emitting layer, wherein the source and drain electrodes comprise first, second, and third layers, respectively, and the first, second, and third layers have each different tapered angle. And the first electrode includes a metallic layer and a conductive layer, and a tapered angle of the metallic layer is different from that of the conductive layer.

In another aspect, an organic light emitting device comprises a transistor positioned on a substrate and comprising gate, source, and drain electrodes, a first electrode connected with the source or the drain electrode, an emitting layer positioned on the first electrode and a second electrode positioned on the emitting layer, wherein the source and drain electrodes comprise first, second, and third layers, respectively, tapered angles of the first, second, and third layers are different from each other. And the first electrode includes a first conductive layer, a metallic layer and a second conductive layer, and at least one or more tapered angles among tapered angles of the first conductive layer, the metallic layer and the second conductive layer are different from each other.

In still another aspect, an organic light emitting device comprises a transistor positioned on a substrate and including gate, source, and drain electrodes, a first electrode connected with the source or the drain electrode, an emitting layer positioned on the first electrode and a second electrode positioned on the emitting layer, wherein the first electrode comprises a metallic layer and a conductive layer, and a tapered angle of the metallic layer and that of the conductive layer are different.

In still another aspect, an organic light emitting device comprises a transistor positioned on a substrate and including gate, source, and drain electrodes, a first electrode connected with the source or the drain electrode, an emitting layer positioned on the first electrode and a second electrode positioned on the emitting layer, wherein the first electrode includes a first conductive layer, a metallic layer, and a second conductive layer, and at least one or more tapered angles among tapered angles of the first conductive layer, the metallic layer, and the second conductive layer are different.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting device comprising:
a transistor on a substrate and including gate, source, and drain electrodes, the source and drain electrodes each including first and second layers;
a first electrode connected to one of the source or drain electrodes;
an organic emitting layer on the first electrode; and
a second electrode on the organic emitting layer,
wherein the first electrode includes a metallic layer and a conductive layer,
wherein a tapered angle of the first layer lies in a range substantially between 70° and 90°, and a tapered angle of the second layer lies in a range substantially between 40° and 50°,
wherein a thickness of the first layer is substantially 400 Å to 450 Å, and a thickness of the second layer is substantially 70 Å to 100 Å,
wherein a tapered angle of the metallic layer lies in a range substantially between 35° and 70°, and a tapered angle of the conductive layer lies in a range substantially between 70° and 90°.

2. An organic light emitting device comprising:
a transistor on a substrate and including gate, source, and drain electrodes, the source and drain electrodes each including first and second layers;
a first electrode connected to one of the source or drain electrodes;
an organic emitting layer on the first electrode; and
a second electrode on the organic emitting layer,
wherein the first electrode includes a first conductive layer, a metallic layer, and a second conductive layer,
wherein a tapered angle of the first layer lies in a range substantially between 70° and 90°, and a tapered angle of the second layer lies in a range substantially between 40° and 50°, wherein a thickness of the first layer is substantially 400 Å to 450 Å, and a thickness of the second layer is substantially 70 Å to 100 Å, wherein a tapered angle of the first conductive layer lies in a range substantially between 50° and 90°, a tapered angle of the metallic layer lies in a range substantially between 35° and 70°, and a tapered angle of the second conductive layer lies in a range substantially between 70° and 90°.

* * * * *